US006959411B2

(12) United States Patent
Lin

(10) Patent No.: US 6,959,411 B2
(45) Date of Patent: Oct. 25, 2005

(54) INTELLIGENT ERROR CHECKING METHOD AND MECHANISM

(75) Inventor: Tzueng-Yau Lin, Tai-Chung Hsien (TW)

(73) Assignee: MediaTek Inc., Hsin-Chu (TW)

(*) Notice: Subject to any disclaimer, the term of this patent is extended or adjusted under 35 U.S.C. 154(b) by 458 days.

(21) Appl. No.: 10/064,212

(22) Filed: Jun. 21, 2002

(65) Prior Publication Data

US 2003/0237040 A1    Dec. 25, 2003

(51) Int. Cl.[7] .............................................. G11C 29/00
(52) U.S. Cl. ........................ 714/763; 714/52; 714/54; 714/6; 714/807; 360/53; 365/200; 369/1; 369/30.21; 369/30.22
(58) Field of Search ............................ 714/776, 707, 714/763, 752, 746, 799, 807, 6, 25, 52, 54; 341/61; 380/44; 360/63; 365/200; 369/1, 369/30.21

(56) References Cited

U.S. PATENT DOCUMENTS

| 6,169,802 B1 * | 1/2001 | Lerner et al. ................. 380/44 |
| 6,278,387 B1 * | 8/2001 | Rayskiy ....................... 341/61 |
| 2002/0133764 A1 * | 9/2002 | Wang .......................... 714/707 |

* cited by examiner

Primary Examiner—Guy Lamarre
Assistant Examiner—Dipakkumar Gandhi
(74) Attorney, Agent, or Firm—Winston Hsu

(57) ABSTRACT

An intelligent MP3 error check detection method and apparatus. The claimed invention discloses an apparatus and method where all MP3 files are initially assumed to have compatible error checksums. A parameter W is initialized to zero. The parameter W is not constant and conceptually represents a state of the error check method. The destructive value of a first predefined constant is added to the parameter W each time the integrity of the data within the frame cannot be verified. The constructive value of a second predefined constant is subtracted from the parameter W each time the integrity of the data within the frame is successfully verified. If the value of the parameter W equals or exceeds a predefined threshold, the remainder of the MP3 file is decoded and played without error check protection.

16 Claims, 2 Drawing Sheets

INTELLIGENT ERROR CHECKING METHOD AND MECHANISM

BACKGROUND OF THE INVENTION

1. Field of the Invention

The present invention relates to a method for error checking when playing an MP3 (Moving Pictures Experts Group Layer III Audio) file. More specifically, a method of playing the MP3 file while providing error check protection when recognizable error check fields exist in an MP3 bitstream, and playing the MP3 bitstream without error checking when recognizable error check fields do not exist in the MP3 bitstream is disclosed.

2. Description of the Prior Art

MPEG-1 audio layer III (MP3) is an ISO/IEC (International Organization for Standardization and International Electrotechnical Commission) standard of audio coding with high quality and high efficiency.

Referring to FIG. 1, an MP3 file comprises a series of frames and each frame comprises several fields such as a header 1, an error check 2, an audio_data 3, and an external_data 4. The header 1 of each frame is further divided into groups of bits relating to the file type, sampling rate, and other frame specific information. A protection bit, bit number 16 of the 32 bit header 1, discloses whether error protection is used in the frame. If the bit number 16 is a value of zero, error protection is used and the header 1 is followed by a 16 bit error check 2. The error check in the error check field 2 uses CRC protection mechanism. When CRC error protection is used in the MP3 file, the initial state of a shift register is '1111 1111 1111 1111' and the CRC generator polynomial is $g(x)=x^{16}+x^{15}+x^2+1$. If the bit number 16 is a value of 1, no error protection is used and there is no error check 2 following the frame header. The audio_data 3 contains the encoded audio samples. The external_data 4 contains other information, such as title, of the encoded audio samples.

While using the error check 2 is not necessary to encode and decode an MP3 file, as with any error trapping routine, error checking can improve performance by correcting or eliminating faulty frames before playing. The error check 2 can be used to determine if the data within the audio_data 3 has been written and read correctly and is quite useful for providing accurate reproduction of sound played from the MP3 file, but is most valuable only if used in a consistent manner. Different encoders can generate different error check fields although the input source is the same. Some encoders may possibly use a wrong generator polynomial, a wrong initial state, or simply calculate incorrectly, all resulting in a wrong error check value. Because of this, the error check field 2 encoded by one encoder is not always acceptable to a different decoder. Additionally, some encoders simply skip using error checking and mark the protection bit of the header with a 1 meaning that no error check field 2 exists within the frame.

Different MP3 decoders deal with this problem with different approaches. One of the most common strategies used is simply not to play MP3 frames with wrong error check fields. This policy does eliminate the noise resulting from individual corrupted frames. However, this same policy makes it impossible to play a file generated by an incompatible encoder or a file simply lacking fields even though all of the other data in the file is complete and correct. Therefore, this approach limits the files that can be played by the decoder to only those MP3 files perfectly compatible with the right CRC field.

Another well-known approach to the incompatibility problem is to go to the other extreme and never use error check protection regardless whether the protection is or is not available. While this strategy allows the playing of all MP3 files regardless of the encoders, the strategy fails to eliminate noise resulting from corrupted frames within a compatible bitstream.

SUMMARY OF INVENTION

It is therefore an objective of the present invention to provide a method and apparatus able to play an MP3 file generated by different encoders, and to additionally provide error check protection when the MP3 file comprises a recognizable error check field. A recognizable error check field is defined to be one with which the apparatus, using the error check field of a frame, can successfully verify the integrity of the data within the frame.

Briefly summarized, the present invention discloses a method where all MP3 files are initially assumed to have compatible error check fields. A parameter W represents a state of the error check method. The destructive value of a first predefined constant is added to the parameter W each time the integrity of the data within the frame cannot be verified. The constructive value of a second predefined constant is subtracted from the parameter W each time the integrity of the data within the frame is successfully verified. If the value of the parameter W equals or exceeds a predefined threshold, the remainder of the MP3 file is decoded and played without any further detection of the error check protection.

A looped process proceeds sequentially through the file. The error check field of each successive frame is checked for validity. If the checksum is valid, meaning that the integrity of data within the frame is confirmed by a control circuit or an algorithm using the error check field, the value held by the parameter W is reduced by a constructive, second predefined constant and the frame is decoded and outputted for play. If the value of the parameter W is less than zero, the value of W is reset to zero. If the checksum is invalid, meaning that the integrity of data within the frame cannot be confirmed by the control circuit or the algorithm using the error check field, the value held by the parameter W is increased by a destructive, first predefined constant and the main data of the frame is not played, but is stored in un-decoded form in a buffer for possible later referencing. The next frame in the MP3 file is located and the looped process continues until either the end of the file is reached or the value of the parameter W equal or exceeds the predefined threshold.

As stated above, if the value of the parameter W equals or exceeds the predefined threshold, attempts to use the error check field of the frame to verify the main data of the frame are abandoned and the remainder of the file is decoded and played without the benefit of error check protection.

It is an advantage of the claimed invention that the method is able to play an MP3 file generated by any encoder, and to additionally provide error check protection when the MP3 file comprises recognizable error check fields.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
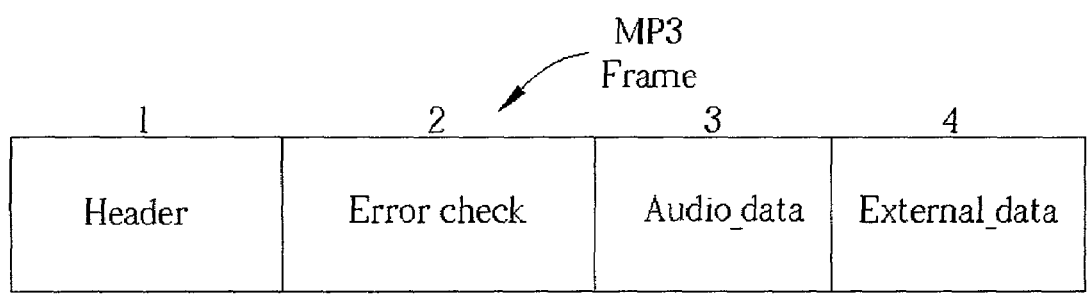
FIG. 1 illustrates an MP3 frame according to a prior art.
Figure 2:
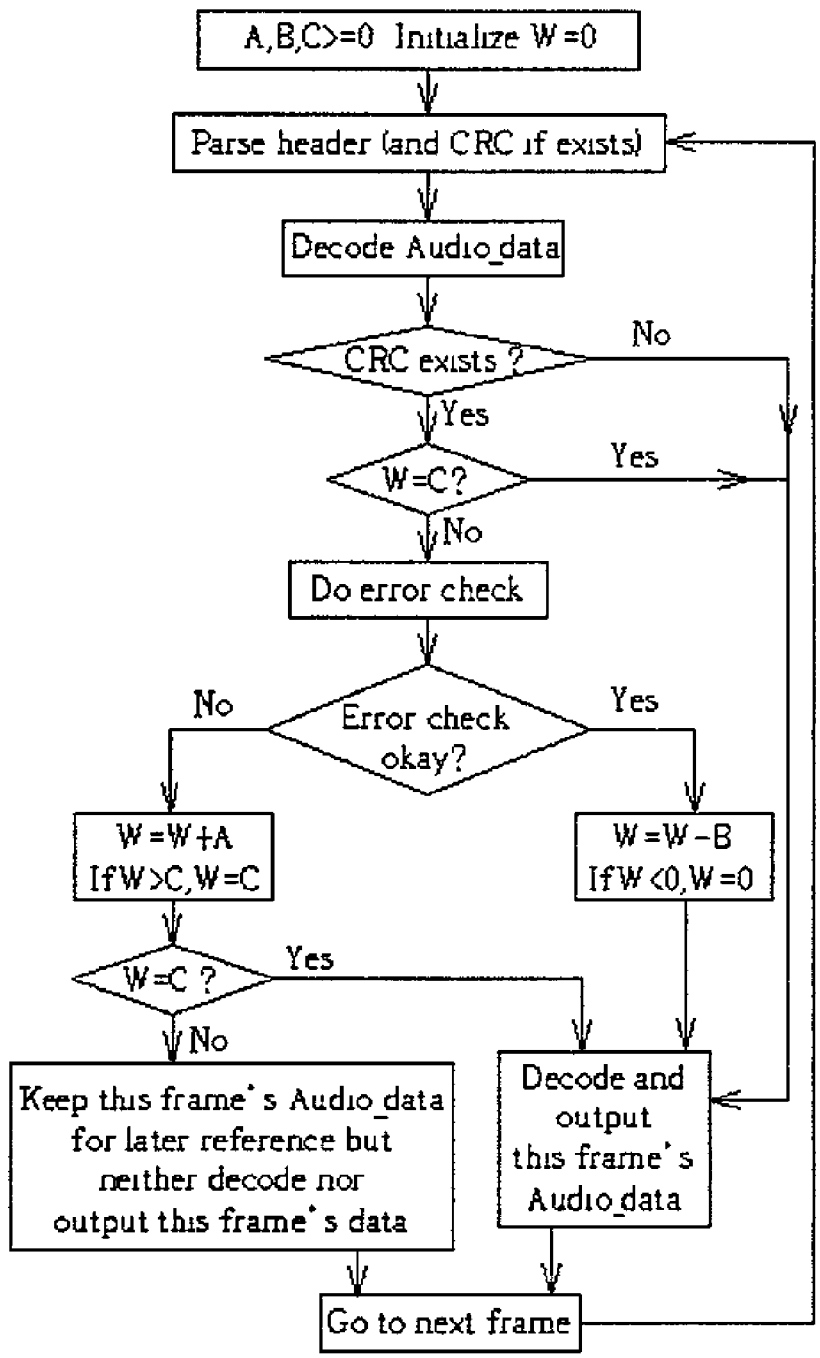
FIG. 2 is a flowchart of CRC detection according to the present invention.

Please refer to FIG. 2 illustrating a flowchart of one embodiment according to the present invention. Four initial parameters A, B, C, and W are used to control whether or not error check protection is to be used when decoding the frames of an MP3 file. In application, these parameters may be variables, registers, or in other forms.

The parameters A, B, and C are normally set to predefined constant values during an MP3 player's manufacture and remain constant throughout the decoding and playing process. The first predefined constant A represents a destructive weighing factor used each time the integrity of the data within a frame cannot be verified. The second predefined constant B represents a constructive weighing factor used each time the integrity of the data within the frame is verified. The third predefined threshold C represents a maximum tolerance for permitted error check errors allowed before abandoning efforts to provide error checking while decoding and outputting the file. In this embodiment of the present invention, the parameters A, B, and C are all set to values greater than or equal to zero, but using one or more negative values and adjusting any calculations accordingly also falls within the scope of the invention.

The parameter W is not constant and represents a state of the error check method. The destructive value of the first predefined constant A is added to the parameter W each time the integrity of the data within the frame cannot be verified. The constructive value of the second predefined constant B is subtracted from the parameter W each time the integrity of the data within the frame is successfully verified. If the value of the parameter W equals or exceeds the predefined threshold C, the remainder of the MP3 file is decoded and played without the benefit of error check protection. The parameter W is initialized to zero before beginning to decode the MP3 file.

The first step in the present method after parameter initialization is to parse the header 1 of a frame and determine if an error check field 2 exists. An audio_data field 3 is decoded next followed by the first decision point in the method. If the parameter W is greater than or equal to the predefined threshold C, the audio_data 3 of the frame is decoded and outputted without error check protection. This allows an MP3 file lacking error checkfields or an MP3 file with unrecognizable error check fields to be properly decoded and played.

If the parameter W is not equal to C (it also means the parameter W is less than the predefined threshold C at this point), an error check is performed and another decision point in the flowchart has been reached. If the results of the error check confirm the integrity of the data in the frame, the constructive factor contained in the second predefined constant B is subtracted from the parameter W. If the subtraction results in the parameter W being less than zero, the parameter W is set to zero. This feature recognizes that otherwise perfectly good MP3 files may contain one or more corrupted frames. Because a valid checksum has been found, by reducing the parameter W the constructive feature ensures using error checking whenever possible. It should be obvious that the ability and tenaciousness of this feature is greatly controlled by the relative magnitudes of the second predefined constant B and the predefined threshold C. After updating the value of the parameter W, the frame is further decoded and output for play.

However, if the results of the error check are not correct, the destructive factor contained in the first predefined constant A is added to the parameter W. If the addition results in the parameter W being greater than the predefined threshold C, the parameter W is set to the same value as the predefined threshold C. This feature also recognizes that otherwise perfectly good MP3 files may contain one or more corrupted frames. Just because an invalid checksum has been found does not necessarily mean that error check protection cannot be used on other frames in the MP3 file. As before, by increasing the parameter W the destructive feature ensures using error checking whenever possible by not abandoning error checking until the predefined threshold C has been reached. It should also be clear that the ability and tenaciousness of this feature is greatly controlled by the relative magnitudes of the first predefined constant A and the predefined threshold C.

After updating the value of the parameter W in the destructive branch of the flowchart (meaning a wrong error check result), another check is made to decide if the parameter W equals the predefined threshold C. When W is greater or equal to C, the maximum threshold for tolerance for errors has been reached and no further error checking will be done on the file. Accordingly, the data of the frame is decoded and outputted without error check protection. If the stated equality does not hold and the parameter W is less than the predefined threshold C, the maximum threshold for tolerance for errors has not been reached. However, it cannot be determined if a single corrupt frame has been found or if the entire file comprises wrong error check fields. In this case, the audio_data 3 of the frame is stored in a buffer for possible later referencing but is neither decoded nor outputted. This feature of the present method prevents the unwanted noise often generated by corrupted or missing data while continuing to provide error check protection to the file.

In contrast to the prior art, the present invention can play an MP3 file generated by different encoders, and to additionally provide error check protection when the MP3 file comprises recognizable error check fields. Additionally, the predefined values of the constants A, B, and the threshold C can be adjusted to determine the sensitivity of the method. For example, when C>0, A=0, and B>0, the method will always perform an error check. When the parameter C=0, the method will never perform an error check. The ability to adjust the values of the constants A, B, and the threshold C provides greater flexibility in the decoding of MP3 files without having to redesign the decoder itself. Depending on the selection of the values for the constants A, B, and the threshold C, the present invention can play an MP3 file processed by different encoders and still provide error check protection whenever possible.

In addition to MP3 file, the present invention could also be applied to other media formats, such as Dolby format, comprising frames including error check fields.

Those skilled in the art will readily observe that numerous modifications and alterations of the method and device may be made while retaining the teachings of the invention. For example, the teaching of providing an error threshold that when reached deactivates an error checking protocol can easily be incorporated into the error checking routines used in the reading of other types of files, such as but not limited to cda files from a cd. Accordingly, the above disclosure should be construed as limited only by the metes and bounds of the appended claims.

What is claimed is:

1. A method of reproducing a media file with a control apparatus, the media file comprising a plurality of frames, each frame having an optional error check field, and an audio data field for storing encoded audio sample, the control apparatus including a parameter, the method comprising:

if the error check field of the frame exists, using the error check field to verify integrity of the frame; if the integrity of the frame is correct, decoding the audio sample in the audio data field; if the integrity of the frame is unable to be confirmed to be correct and the parameter indicates that the error check field no longer needs to be used to verify the integrity of the frame, decoding the audio sample in the audio data field; if the integrity of frame is unable to be confirmed to be correct and the parameter indicates that the error check field is to be used to verify the integrity of the frame, storing the audio data field for later reference without decoding the audio sample stored in the audio data field.

2. The method of claim 1 wherein a first predefined constant is used as a destructive factor in calculations determining whether or not to continue using the error check field to verify the integrity of the data within the frame.

3. The method of claim 2 wherein a second predefined constant is used as a constructive factor in calculations determining whether or not to continue using the error check field to verify the integrity of the data within the frame.

4. The method of claim 3 wherein the parameter is a totalizer for accumulating the constructive and destructive factors utilized during processing of the media file so that when the value held in the totalizer is less than a predetermined threshold, the method continues using the error check field to verify the integrity of the data within the frame and when the value held in the totalizer is greater than or equal to the predetermined threshold, the error check field is not to be used to verify the integrity of the data within the frame.

5. The method of claim 4 wherein the totalizer is a variable, a register, or a counter.

6. The method of claim 1 wherein the area of the frame capable of being verified as correct by the control apparatus excludes the error check field.

7. The method of claim 1 wherein the media file is an MP3 file.

8. The method of claim 1 wherein the control apparatus is implemented by a circuit or an algorithm.

9. An apparatus for decoding and outputting a media file, the media file comprising a plurality of frames, the apparatus comprising:

a control apparatus capable of decoding and outputting audio data of the frame if integrity of the audio data of the frame is not verifiable by the control apparatus using an error check field of the frame, and capable of using the error check field of the frame for error checking if the integrity of the audio data of the frame is verifiable by the control apparatus using the error check field of the frame when decoding and outputting the audio data of the frame;

wherein a first predefined constant is used as a destructive factor in calculations determining whether or not to continue using the error check field to verify the integrity of the data within the frame.

10. The apparatus of claim 9 further comprising a parser for parsing a frame in the MP3 file, a decoder for decoding data within the frame, and a buffer for storing audio data of the frame.

11. The apparatus of claim 9, wherein the control apparatus is implemented by a circuit or an algorithm.

12. The apparatus of claim 9 wherein a second predefined constant is used as a constructive factor in calculations determining whether or not to continue using the error check field to verify the integrity of the data within the frame.

13. A method of playing a media file with a control apparatus, the media file comprising a plurality of frames, each frame optionally comprising an error check field, the method comprising:

playing media file using the error check field to verify integrity of each frame as long as a value of a parameter within a predetermined range;

while playing media file using the error check field to verify integrity of each frame, using a first predefined constant as a destructive factor in calculations determining the value of the parameter; and continuing to play the media file without verifying the integrity of each frame once the value of the parameter is not within the predetermined range.

14. The method of claim 13 further comprising using a second predefined constant as a constructive factor in calculations determining the value of the parameter while playing the media file using the error check field to verify integrity of each frame.

15. The method of claim 14 further comprising while playing the media file using the error check field to verify integrity of each frame, if integrity of a current frame cannot be verified, storing an audio data field of the current frame for later reference without decoding an audio sample stored in the audio data field.

16. The method of claim 13 wherein the predetermined range extends from zero to less than one.

* * * * *